United States Patent
Hayes et al.

(10) Patent No.: US 8,592,241 B2
(45) Date of Patent: Nov. 26, 2013

(54) METHOD FOR PACKAGING AN ELECTRONIC DEVICE ASSEMBLY HAVING A CAPPED DEVICE INTERCONNECT

(75) Inventors: Scott M. Hayes, Chandler, AZ (US); Jason R. Wright, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 119 days.

(21) Appl. No.: 13/246,990

(22) Filed: Sep. 28, 2011

(65) Prior Publication Data

US 2013/0078753 A1      Mar. 28, 2013

(51) Int. Cl.
*H01L 21/00*      (2006.01)

(52) U.S. Cl.
USPC ............................ 438/51; 438/106; 257/717

(58) Field of Classification Search
USPC .................... 438/51, 106; 257/717, 783, 787
See application file for complete search history.

(56) References Cited

U.S. PATENT DOCUMENTS

| | | |
|---|---|---|
| 6,838,776 B2 | 1/2005 | Leal et al. |
| 6,906,406 B2 | 6/2005 | Hwang et al. |
| 8,072,083 B1 * | 12/2011 | St. Amand et al. ............ 257/777 |
| 2008/0083960 A1 * | 4/2008 | Chen et al. .................... 257/416 |

* cited by examiner

*Primary Examiner* — Phuc Dang
(74) *Attorney, Agent, or Firm* — Jonathan N. Geld

(57) ABSTRACT

A method for fabricating a thin package that encapsulates a capped MEMS device electrically coupled with one or more encapsulated semiconductor devices is provided. A wafer-level packaging methodology is used in which the capped MEMS device is electrically coupled to a package interconnect, which then allows for electrical coupling to the one or more encapsulated semiconductor devices, as well as external connections.

19 Claims, 3 Drawing Sheets

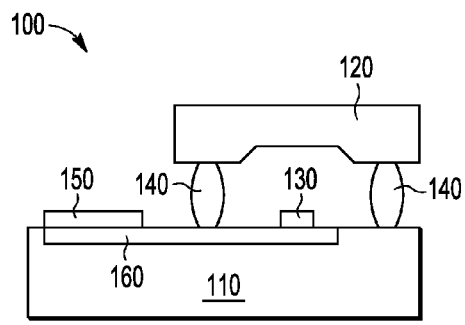
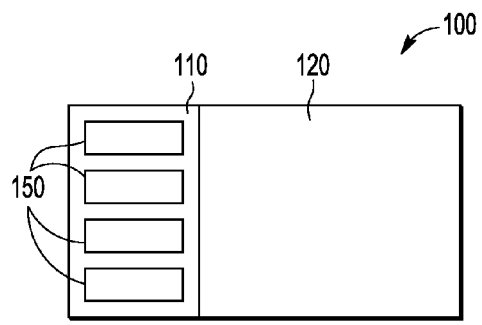
FIG. 1A
- PRIOR ART -
FIG. 1B
- PRIOR ART -
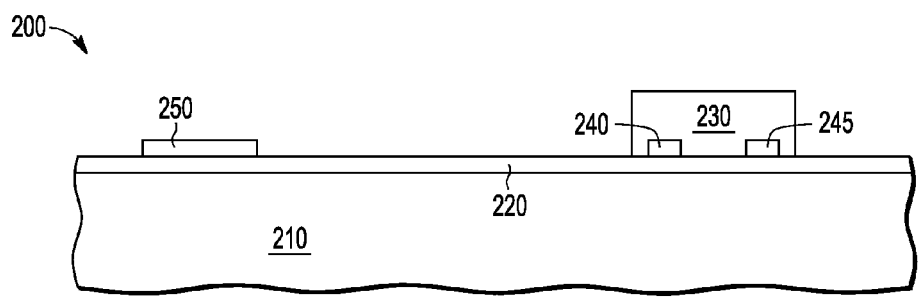
FIG. 2
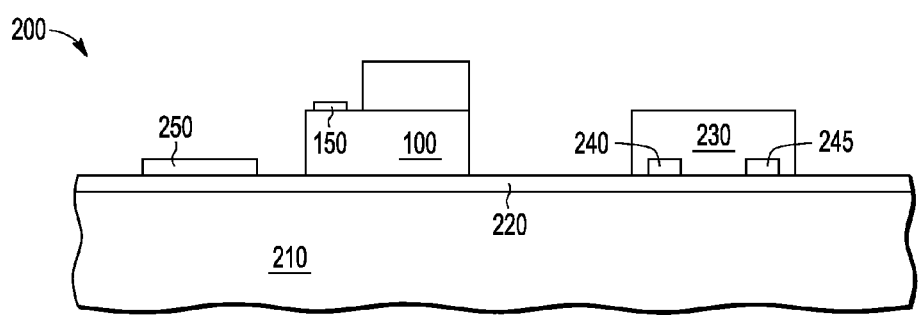
FIG. 3

METHOD FOR PACKAGING AN ELECTRONIC DEVICE ASSEMBLY HAVING A CAPPED DEVICE INTERCONNECT

BACKGROUND

1. Field

This disclosure relates generally to semiconductor packaging, and more specifically, to incorporating a capped semiconductor device in a package having interconnected components.

2. Related Art

In an ever-increasing number of devices, including consumer devices and medical devices, it is becoming desirable to incorporate a greater variety of micro-electromechanical sensor (MEMS) devices for added usability and functionality. MEMS devices are small integrated devices that combine electrical and mechanical components, ranging in size from a sub micron level to millimeter level. Examples of MEMS devices include accelerometers, inertial sensors, micro actuators, pressure and flow sensors. Semiconductor MEMS devices are typically formed on a substrate and then protected with a cap, which makes a MEMS device relatively thick as compared to other semiconductor devices.

MEMS devices can be protected in a package for incorporating the MEMS device into a system. Traditionally, a MEMS device is encapsulated separately into a QFN or other type of package, and then coupled to a processor or ASIC via a printed circuit board. A drawback of this method of combining a MEMS device with a processor externally is that such a configuration can be physically larger than is ideal or allowable for some applications. Another typical method for incorporating a MEMS device into a system is to stack the MEMS device with a processor or ASIC and then encapsulate the stack as a package. A drawback of this method of combining a MEMS device with a processor is the thickness of the encapsulated stack may be physically larger than some applications may allow.

It is therefore desirable to provide a thin package combining a MEMS device with a processor or ASIC for space-constrained system-in-package applications. One issue to overcome in providing such a package is that electrical contacts for a MEMS device are typically located on a top surface of the substrate in a region of the substrate not protected by the cap. In certain packaging technologies (e.g., redistributed chip packaging and fan out-wafer level packaging), this removes the MEMS device contacts from a region typically used for interconnect purposes. Therefore, a way must be found to electrically couple the MEMS device contacts with contacts for the incorporated processor or ASIC.

BRIEF DESCRIPTION OF THE DRAWINGS

The present invention may be better understood, and its numerous objects, features, and advantages made apparent to those skilled in the art by referencing the accompanying drawings.

FIG. 1A is a simplified cross-sectional diagram of an example MEMS device usable in conjunction with the present invention.

FIG. 1B is a top view of the example MEMS device.

FIG. 2 is a simplified block diagram illustrating a cross-sectional view of a device structure at a stage in one example of processing, according to an embodiment of the present invention.

FIG. 3 is a simplified block diagram illustrating the cross-sectional view of the device structure at a later stage in the processing example.

The use of the same reference symbols in different drawings indicates identical items unless otherwise noted. The figures are not necessarily drawn to scale.

DETAILED DESCRIPTION

Figure 4:
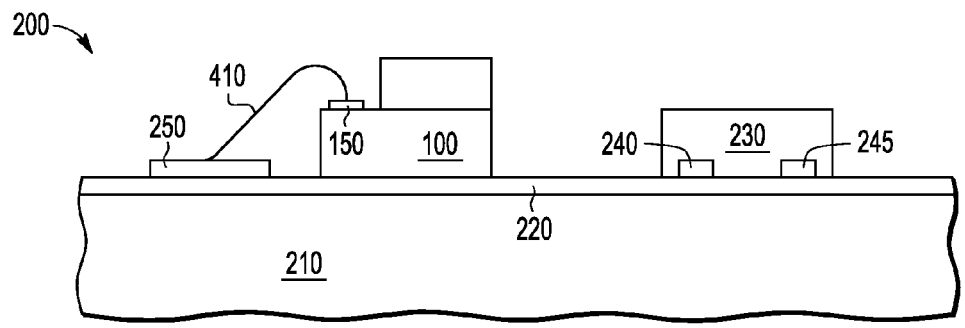
FIG. 4 is a simplified block diagram illustrating the cross-sectional view of the device structure at a later stage in the processing example.

A method for fabricating a thin package that encapsulates a capped MEMS device electrically coupled with one or more encapsulated semiconductor devices is provided. A wafer-level packaging methodology is used in which the capped MEMS device is electrically coupled to a package interconnect, which then allows for electrical coupling to the one or more encapsulated semiconductor devices, as well as external connections.

Fan-out wafer-level packaging (FO-WLP) and redistributed chip packaging (RCP) provide thin semiconductor packages. This is accomplished, in part, by placing various components to be incorporated in a package on an adhesive layer attached to a carrier, for example. After the various components have been encapsulated or molded and the encapsulant has been cured, the adhesive layer is removed from the carrier and the encapsulated panel, typically by thermal detachment means. An electrical connection buildup is then performed on one or both major surfaces of the package to couple the components in the package to one another and to external contacts by, for example, providing vias to contacts of the package components.

FIG. 1A is a simplified cross-sectional diagram of an example MEMS device 100 usable in conjunction with the present invention. MEMS device 100 has a silicon substrate 110 and a cap 120, which protects micro-electromechanical portion 130 by using hermetic seals 140. Micro-electromechanical portion 130 is coupled to one or more electrical contacts 150 (e.g., bond pads) by, for example, a polysilicon conductor 160. FIG. 1B is a top view of MEMS device 100, showing substrate 110 and cap 120, with electrical contacts 150 on the substrate.

The thick substrate of MEMS device 100 places electrical contacts 150 in a location that is atypical for FO-WLP and RCP techniques. That is, the contacts are not on the top or bottom of the MEMS stack, but are instead at an intermediate level. A typical thickness of a MEMS cap and hermetic seals is on the order of 150 microns. This is too great a thickness to overcome with techniques such as blind vias, stacked bumps, stud bumping or solder solutions. Solder bumps have too large a diameter compared to the spacing of MEMS electrical contacts to one another. Therefore, in order to incorporate MEMS devices into a package formed by FO-WLP or RCP techniques, a method is needed for joining the electrical contacts of the MEMS device to the package interconnect built up on a surface of the package. Such connection should be made in a manner that protects thermally-sensitive adhesives and other portions of the FO-WLP or RCP laminates.

One embodiment of the present invention provides such a solution by placing the MEMS device in the package area such that the contacts (e.g., contacts 150) are face up or otherwise available for subsequent processing. Bond points for coupling the MEMS contacts are then provided in the package area. These bond points can take the form of, for example, an embedded ground plane modified with bond fingers or an embedded lead frame. The type of bond points used are application-specific. The MEMS contacts are then coupled to the bond points using modified wire bonding methods, as will be discussed more fully below. The package area, including any other devices to be incorporated in the package (e.g., a processor or ASIC), is then encapsulated in a mold compound. Once encapsulated, and interconnect buildup can be performed as appropriate to couple the MEMS device to the other incorporated devices and external contacts via the bond points.

FIG. 2 is a simplified block diagram illustrating a cross-sectional view of a device structure 200 at a stage in one example of processing, according to an embodiment of the present invention. A carrier 210 has an adhesive layer 220 on which is placed a semiconductor die 230. Adhesive layer 220 can be of a standard type used in semiconductor packaging processing including, for example, a double-sided polyimide sticky tape having a silicone adhesive on both sides. The adhesive layer should be of a type that can withstand the packaging processing without becoming brittle or permanently fixed in place, since at a later point in processing the adhesive layer will be separated from the package. Semiconductor die 230 is placed active surface face down on adhesive layer 220. The "active surface" of semiconductor die 230 is a surface of the die having bond pads 240 and 245.

In addition to semiconductor die 230, a bond pad 250 is also placed on adhesive layer 220. Bond pad 250 can take a variety of forms. In one example, bond pad 250 can be a portion of an embedded ground plane to be incorporated in a semiconductor device package. In another example, bond pad 250 can be a portion of a lead frame to be incorporated in the semiconductor device package. Bond pad 250 and the associated embedded ground plane or lead frame can be made from a variety of materials standard in the art of semiconductor packaging and suitable to the application (e.g., copper, iron, zinc, nickel, magnesium, and the like, as well as alloys made therefrom). As will be discussed more fully below, in an alternative embodiment no bond pads need to be incorporated separately into the device structure.

FIG. 3 is a simplified block diagram illustrating the cross-sectional view of device structure 200 at a later stage in the processing example. MEMS device 100 is also placed on adhesive layer 220. MEMS device 100 is placed such that electrical contacts 150 of the MEMS device are accessible for further processing (e.g., face up).

FIG. 4 is a simplified block diagram illustrating the cross-sectional view of device structure 200 at a later stage in the processing example. A MEMS device electrical contact 150 is coupled to bond pad 250 by connection 410. In one embodiment, connection 410 is a wire bond. Other types of connections 410 can be formed, including, for example, deposited conductive material (e.g., printed conductive lines).

For the wire bond connection embodiment, in order to protect adhesive layer 220 and the laminate structure formed by the adhesive layer, wire bonding techniques are modified to form wire bond connection 410. Typical wire bonding techniques require heating endpoints of the wire bond to approximately 125° C. But adhesive layers such as adhesive layer 220 are typically thermally sensitive and developed to separate from the carrier at temperatures of approximately 110° C., and delamination effects can be experienced at temperatures as low as 90° C. In order to provide a wire bond between MEMS device electrical contact 150 and bond pads 250, temperatures of approximately 75° C. are used to avoid delamination between the bond pad, the adhesive layer, and the carrier. In order to minimize wire height from wire bond connection to electrical contact 150, a stitch on ball bump (or "reverse bonding") process can be used. Using a typical wire bond process, the wire height can exceed the MEMS cap limiting the package thickness. In addition, reverse bonding can be used for bonding the connection 410 to bond pad 250 to minimize height of the connection wire.

In one alternative embodiment, bond pads 250 may be dispensed with and alternative means for coupling the MEMS contacts to a package interconnect may be used. For example, the wire bond metal may be used to form a ball or to contact a ball or conductive pillar that is placed or otherwise formed on the adhesive layer. This contact is then used in connecting to a subsequently formed interconnect, as discussed more fully below.

Figure 5:
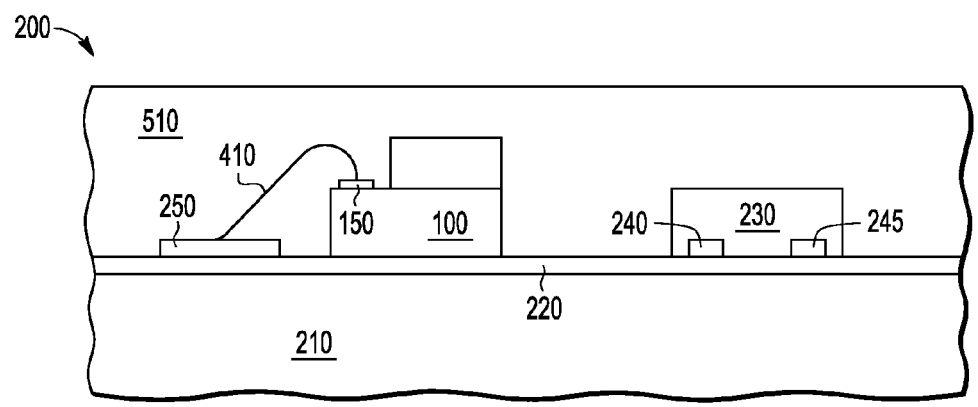
FIG. 5 is a simplified block diagram illustrating the cross-sectional view of the device structure at a later stage in the processing example.

FIG. 5 is a simplified block diagram illustrating the cross-sectional view of device structure 200 at a later stage in the processing example. A molding material is applied to the structures affixed to adhesive layer 220 (e.g., semiconductor die 230, bond pad 250, MEMS device 100, and wire bond 410), forming an encapsulant 510 that encapsulates the structures within the molding material and forms a panel. The molding material can be any appropriate encapsulant including, for example, silica-filled epoxy molding compounds, plastic encapsulation resins, and other polymeric materials such as silicones, polyimides, phenolics, and polyurethanes. The molding material can be applied by a variety of standard processing techniques used in encapsulation including, for example, printing, pressure molding and spin application. Once the molding material is applied, the panel can be cured by exposing the materials to certain temperatures for a period of time, or by applying curing agents, or both. In a typical encapsulation process, a depth of encapsulant 510 can exceed a maximum height of structures embedded in the molding material (e.g., the height of MEMS device 100, as illustrated in FIG. 5).

Figure 6:
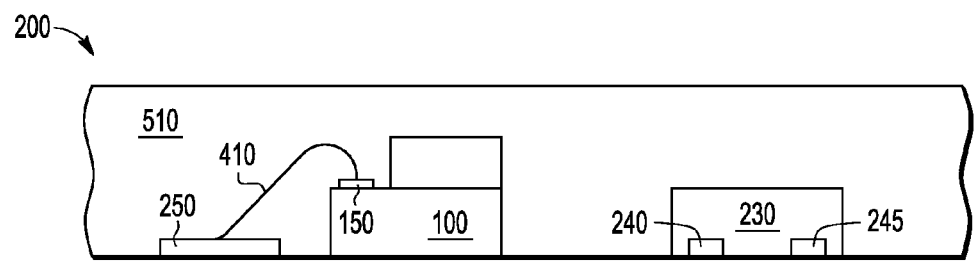
FIG. 6 is a simplified block diagram illustrating the cross-sectional view of the device structure at a later stage in the processing example.

FIG. 6 is a simplified block diagram illustrating the cross-sectional view of device structure 200 at a later stage in the processing example. The encapsulated panel is removed from adhesive layer 220 (and carrier 210). Once released from the adhesive layer, the side of the panel previously attached to the adhesive layer can be cleaned to remove any excess adhesive remaining attached to the encapsulated panel. This process of adhesive release and clean exposes all of the contacts on the bottom side of the panel, including semiconductor die contacts 240 and 245, as well as bond pad 250 or other connection created during the panelization process discussed above. As discussed above, release of adhesive layer 220 can be performed by the application of heat to the region in which adhesive layer 220 is applied.

In addition, prior to removing the encapsulated panel from the adhesive layer, encapsulant 510 can be reduced in thickness to provide a desired panel thickness. This reduction in thickness of the encapsulant can be performed by a grinding process, chemical etching, laser ablation, or other conventional techniques (e.g., back grinding), or alternatively by forming the encapsulant to the appropriate thickness during the encapsulation process.

Figure 7:
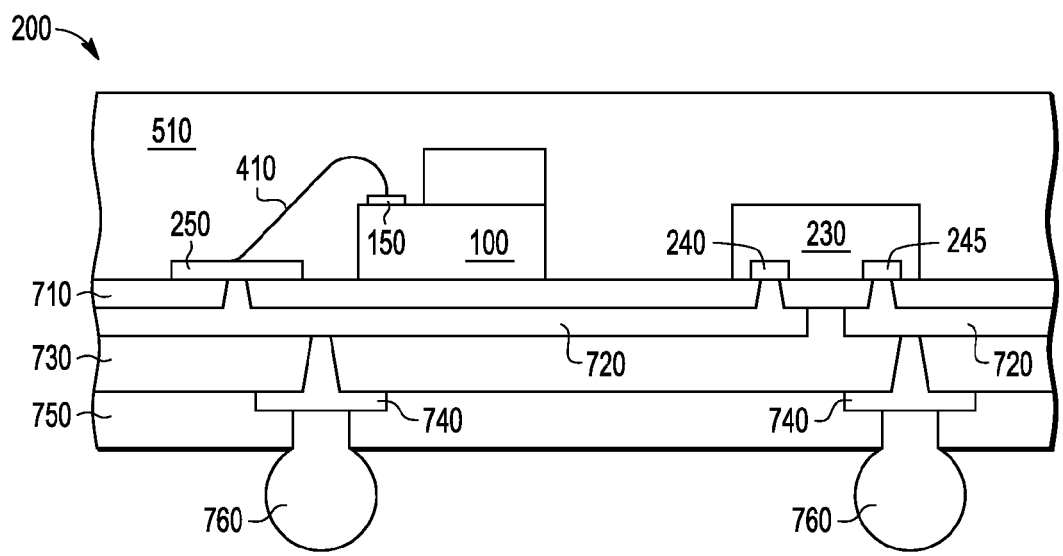
FIG. 7 is a simplified block diagram illustrating the cross-sectional view of the device structure after buildup and ball placement.

FIG. 7 is a simplified block diagram illustrating the cross-sectional view of device structure 200 after buildup and ball placement. Processing providing the various layers illustrated in FIG. 7 can be provided by standard techniques used in semiconductor packaging.

An insulating layer 710 can be formed over the bottom surface of the encapsulated die, MEMS device, bond pads and encapsulation molding material. Insulating layer 710 can be made from organic polymers, for example, in liquid or dry film and can include a wide range of other materials used for interlayer dielectrics as known in the art (e.g., silicon dioxide, silicon nitride, silicon oxynitride, or any combination of such layers providing electrical isolation). Insulating layer 710 can be patterned to expose die contacts 240 and 245, as well as bond pad 250.

A conductive layer 720 can then be formed to provide an interconnect between the die contacts and bond pad, as well as any other electrical contacts or pathways provided in the encapsulated device structure (e.g., through vias). Conductive layer 720 can include materials such as metal, metal alloy, doped semiconductor, semi-metals, or combinations thereof as known in the art (e.g., amorphous silicon, doped polysilicon, aluminum, copper, tantalum, titanium, tungsten, or any metal alloy, nitride or silicide). Through the use of the conductive layer, any number of contacts and bond pads can be interconnected in any combination to the same or other devices or any other contacts (e.g., through vias). The interconnect illustrated in FIG. 7 is provided only by way of example, and it should be realized that the interconnects formed by conductive layer 720 and other conductive layers discussed below can extend not only across the page, as illustrated, but also into and above the page.

An additional interconnect layer can be provided by forming additional insulating layers (e.g., insulating layer 730) and patterning those insulating layers to receive additional conductive layers (e.g., conductive layer 740). The range of materials that can be used for subsequent insulating layers and conductive layers can include those listed for insulating layer 710 and conductive layer 720, and each type of layer can be the same or different materials as required by the nature of the application.

Further, an insulating layer 750 can be formed and patterned to expose pads formed by conductive layer 740. Optionally, a set of conductive ball connectors can be provided by forming and placing conductive balls 760 on the exposed pads using standard techniques and materials. After buildup of the desired interconnects has been performed, individual semiconductor packages can be separated from the panel using a singulation process.

As discussed above, one object of embodiments of the present invention is to form thin packages that combine one or more MEMS devices with one or more semiconductor devices such as a processor or ASIC. Device structure 200 provides such a thin package through side-by-side placement of MEMS and other semiconductor devices, modified wire bonding, and interconnect buildup techniques. It should be realized, however, that embodiments of the present invention are not limited to device packages that have a single-side interconnect buildup. Through vias can be provided by a variety of techniques, such as drilling or pre-placement, which allow for connections to be made between the bottom-side interconnect and a top-side interconnect. The top side interconnect can be formed by standard techniques (e.g. dielectric layer and metal layer buildup), and allow for three-dimensional package stacking or other top-side connections.

By now it should be appreciated that there has been provided a method for packaging an electronic device assembly including a MEMS device, wherein the method includes steps for: placing the MEMS device in a first area for the electronic device assembly; placing an electronic device in a second area for the electronic device assembly; placing one or more bond pads in a third area for the electronic device assembly; electrically coupling an electrical contact of the MEMS device and a bond pad of the one or more bond pads; forming an encapsulant over and around sides of the MEMS device, the electronic device, the one or more bond pads, and the electrical coupling between the MEMS device and the bond pad; exposing a first side of the electronic device assembly after forming the encapsulant wherein the first side includes the bond pad and an electrical contact of the electronic device; and forming an interconnect structure on the first side of the electronic device assembly where the interconnect structure couples the bond pad to the electrical contact of the electronic device.

In one aspect of the above embodiment, the method further includes providing an adhesive disposed on a carrier, and placing the electronic device includes placing a side of the electronic device that includes the electrical contact of the device down on the adhesive, placing the MEMS device includes placing the MEMS device on the adhesive such that the electrical contact of the MEMS device is accessible for performing the electrical coupling, and placing the one or more bond pads includes placing the bond pads on the adhesive. In a further aspect, electrically coupling the MEMS device and the bond pad includes forming a wire bond between the electrical contact of the MEMS device and the bond pad. In still a further aspect, the adhesive separates from the carrier at a separation temperature, so forming the wire bond between the electrical contact of the MEMS device and the bond pad further includes performing wire bonding to the bond pad at a temperature below the separation temperature. In yet a further aspect, the wire bonding to the bond pad is performed at a temperature below 90° C.

In another aspect of the above embodiment, the electronic device is a processor configured to process data generated by the MEMS device. In another aspect of the above embodiment, the electronic device is an application-specific integrated circuit configured to process data generated by the MEMS device. Another aspect of the above embodiment provides for placing an embedded ground plane in the third area for the electronic device assembly where the embedded ground plane includes the one or more bond pads. And another aspect of the above embodiment includes placing a lead frame in the third area for the electronic device assembly where the lead frame includes the one or more bond pads.

Another embodiment of the present invention provides a method for packaging an electronic device assembly where the method includes steps for: forming the electronic device assembly comprising a MEMS device and electronic device that are both encapsulated in the electronic device assembly; and electrically coupling the MEMS device to the electronic device using an interconnect structure formed on a first side of the electronic device assembly and a conductive coupling between an electrical contact of the MEMS device and the interconnect structure. In one aspect of the above embodiment, forming the electronic device assembly includes providing an adhesive layer disposed on a carrier, placing the MEMS device on the adhesive layer in a first area for the electronic device assembly, and placing the electronic device on the adhesive layer in a second area for the electronic device assembly. In a further aspect, forming the electronic device assembly further includes placing one or more bond pads in a third area for the electronic device assembly, and electrically coupling the MEMS device to the electronic device further includes electrically coupling an electrical contact of the MEMS device to a bond pad of the one or more bond pads and electrically coupling the bond pad to the interconnect structure.

In still a further aspect, electrically coupling the electrical contact of the MEMS device to the bond pad further includes forming a wire bond between the electrical contact of the MEMS device and the bond pad. In still a further aspect, the adhesive layer is configured to separate from the carrier at a separation temperature and forming the wire bond between the electrical contact of the MEMS device and the bond pads is performed at a temperature below the separation temperature. In yet a further aspect, performing the wire bonding to the bond pad further includes using a reverse bonding technique. In another aspect, performing the wire bonding to the electrical contact of the MEMS device includes using a reverse bonding technique, with or without using a separate bond pad.

In another aspect of the above embodiment, electrically coupling the electrical contact of the MEMS device to the bond pad further includes depositing a conductive path between the electrical contact of the MEMS device and the bond pad. In another aspect of the above embodiment, the placing of one or more bond pads in the third area for the electronic device assembly further includes placing a lead frame in the third area for the electronic device assembly where the lead frame includes the one or more bond pads. And in another aspect of the above embodiment, the electronic device is one of a processor or an application-specific integrated circuit configured to process data generated by the MEMS device.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for packaging an electronic device assembly, the method comprising:

placing a micro-electromechanical sensor (MEMS) device in a first area for the electronic device assembly;

placing an electronic device in a second area for the electronic device assembly;

placing one or more bond pads in a third area for the electronic device assembly;

electrically coupling an electrical contact of the MEMS device and a bond pad of the one or more bond pads;

forming an encapsulant over and around sides of the MEMS device, the electronic device, the one or more bond pads, and the electrical coupling between the MEMS device and the bond pad;

exposing a first side of the electronic device assembly after said forming the encapsulant, wherein the first side comprises the bond pad and an electrical contact of the electronic device; and forming, after said exposing, an interconnect structure on the first side of the electronic device assembly, wherein the interconnect structure couples the bond pad to the electrical contact of the electronic device.

2. The method of claim 1 further comprising:

providing an adhesive disposed on a carrier, wherein
said placing the electronic device comprises placing a side of the electronic device comprising the electrical contact of the device down on the adhesive,
said placing the MEMS device comprises placing the MEMS device on the adhesive such that the electrical contact of the MEMS device is accessible for said electrically coupling, and
said placing the one or more bond pads comprises placing the bond pads on the adhesive.

3. The method of claim 2 wherein said electrically coupling the MEMS device and the bond pad comprises forming a wire bond between the electrical contact of the MEMS device and the bond pad.

4. The method of claim 3, wherein
the adhesive is configured to separate from the carrier at a separation temperature, and
said forming the wire bond between the electrical contact of the MEMS device and the bond pad further comprises performing wire bonding to the bond pad at a temperature below the separation temperature.

5. The method of claim 4 wherein said forming the wire bond between the electrical contact of the MEMS device and the bond pad further comprises performing the wire bonding to the bond pad at a temperature below 90° C.

6. The method of claim 1 wherein the electronic device is a processor configured to process data generated by the MEMS device.

7. The method of claim 1 wherein the electronic device is an application specific integrated circuit configured to process data generated by the MEMS device.

8. The method of claim 1 further comprising:

placing an embedded ground plane in the third area for the electronic device assembly, wherein the embedded ground plane comprises the one or more bond pads.

9. The method of claim 1 further comprising:

placing a lead frame in the third area for the electronic device assembly, wherein the lead frame comprises the one or more bond pads.

10. A method for packaging an electronic device assembly, the method comprising:

forming the electronic device assembly comprising a micro-electromechanical sensor (MEMS) device and an electronic device, wherein the MEMS device and the electronic device are encapsulated in the electronic device assembly; and electrically coupling the MEMS device to the electronic device using an interconnect structure formed on a first side of the electronic device assembly and a conductive coupling between an electrical contact of the MEMS device to the interconnect structure, wherein
the electronic device is one of a processor or an application specific integrated circuit configured to process data generated by the MEMS device.

11. The method of claim 10 wherein said forming the electronic device assembly comprises:
providing an adhesive layer disposed on a carrier;
placing the MEMS device on the adhesive layer in a first area for the electronic device assembly; and
placing the electronic device on the adhesive layer in a second area for the electronic device assembly.

12. The method of claim 11, wherein
said forming the electronic device assembly further comprises placing one or more bond pads in an third area for the electronic device assembly; and
said electrically coupling the MEMS device to the electronic device further comprises
electrically coupling an electrical contact of the MEMS device to a bond pad of the one or more bond pads, and
electrically coupling the bond pad to the interconnect structure.

13. The method of claim 12 wherein electrically coupling the electrical contact of the MEMS device to the bond pad further comprises forming a wire bond between the electrical contact of the MEMS device and the bond pad.

14. The method of claim 13, wherein
the adhesive layer is configured to separate from the carrier at a separation temperature, and
said forming the wire bond between the electrical contact of the MEMS device and the bond pad further comprises performing wire bonding to the bond pad at a temperature below the separation temperature.

15. The method of claim 14 wherein said performing wire bonding to the bond pad further comprises using a reverse bonding technique.

16. The method of claim 13 wherein said forming the wire bond at the electrical contact of the MEMS device comprises using a reverse bonding technique.

17. The method of claim 12 wherein electrically coupling the electrical contact of the MEMS device to the bond pad further comprises depositing a conductive path between the electrical contact of the MEMS device and the bond pad.

18. The method of claim 12 wherein said placing one or more bond pads in a third area for the electronic device assembly further comprises placing an embedded ground plane in the third area for the electronic device assembly, wherein the embedded ground plane comprises the one or more bond pads.

19. The method of claim 12 wherein said placing one or more bond pads in a third area for the electronic device assembly further comprises placing a lead frame in the third area for the electronic device assembly, wherein the lead frame comprises the one or more bond pads.

* * * * *